(12) United States Patent
Weinrich

(10) Patent No.: US 6,734,459 B2
(45) Date of Patent: May 11, 2004

(54) SEMICONDUCTOR MEMORY CELL

(75) Inventor: Volker Weinrich, Paris (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/133,337

(22) Filed: Apr. 26, 2002

(65) Prior Publication Data

US 2002/0159316 A1 Oct. 31, 2002

(30) Foreign Application Priority Data

Apr. 26, 2001 (DE) ......................... 101 20 516

(51) Int. Cl.⁷ .............................................. H01L 29/04
(52) U.S. Cl. ..................... 257/71; 257/295; 257/306; 257/310
(58) Field of Search ..................... 257/71, 295, 306, 257/310

(56) References Cited

U.S. PATENT DOCUMENTS

| | | | |
|---|---|---|---|
| 5,369,296 A | * 11/1994 | Kato ........................ 257/295 |
| 5,604,145 A | 2/1997 | Hashizume et al. |
| 5,719,416 A | 2/1998 | Yoshimori et al. |
| 5,796,134 A | * 8/1998 | Kim ........................ 257/295 |
| 6,294,798 B1 | * 9/2001 | Zambrano ................. 257/71 |
| 6,297,527 B1 | * 10/2001 | Agarwal et al. ........... 257/306 |

FOREIGN PATENT DOCUMENTS

EP          0 971 392 A1      1/2000

* cited by examiner

Primary Examiner—David Nelms
Assistant Examiner—Dao H Nguyen
(74) Attorney, Agent, or Firm—Laurence A. Greenberg; Werner H. Stemer; Ralph E. Locher

(57) ABSTRACT

A semiconductor memory cell is formed in a substrate and includes a capacitor, a transistor, and an electrical contact. The transistor includes a doped region which is disposed in the substrate. An insulation layer is disposed on the substrate and the transistor. The capacitor is disposed on the insulation layer and includes a bottom capacitor electrode, a capacitor insulator on the bottom capacitor electrode, and a top capacitor electrode on the capacitor insulator. The bottom capacitor electrode is conductively connected to the doped region of the transistor through the use of the contact. Because the bottom capacitor electrode is conductively connected to the doped region only after the recrystallization of the capacitor insulator, the recrystallization step does not damage the electrical contact.

8 Claims, 4 Drawing Sheets

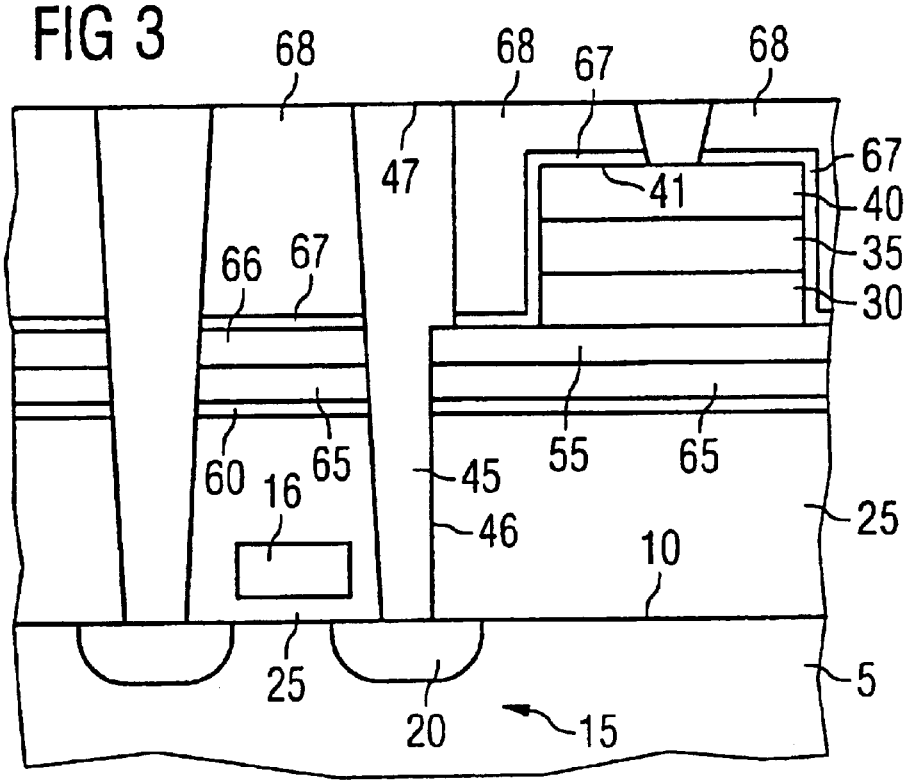
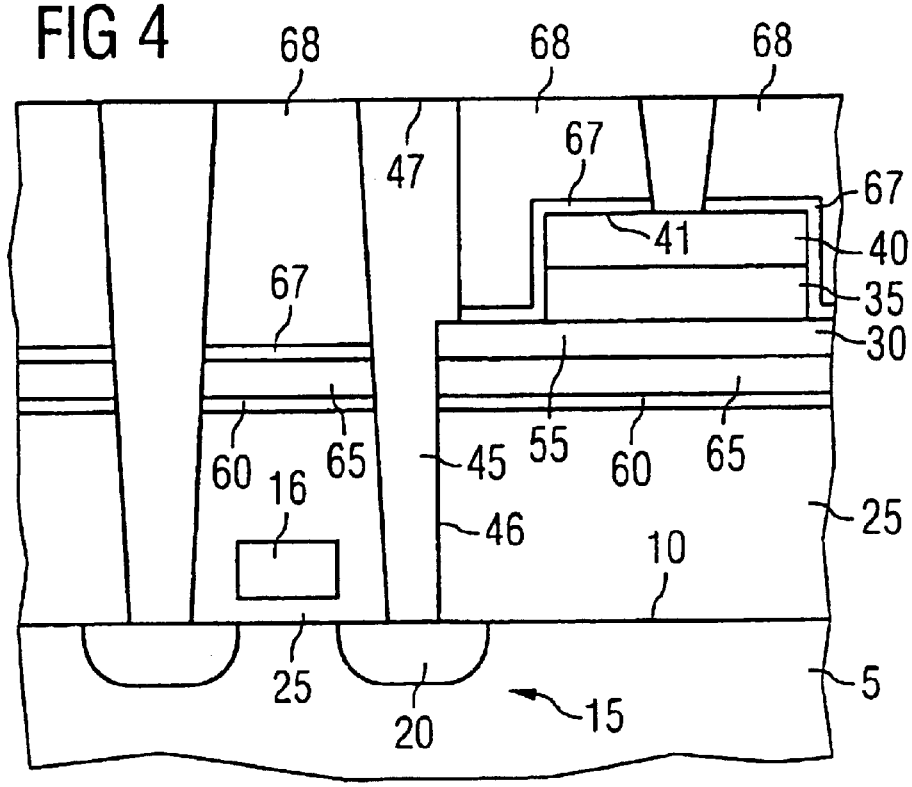

20  55   30

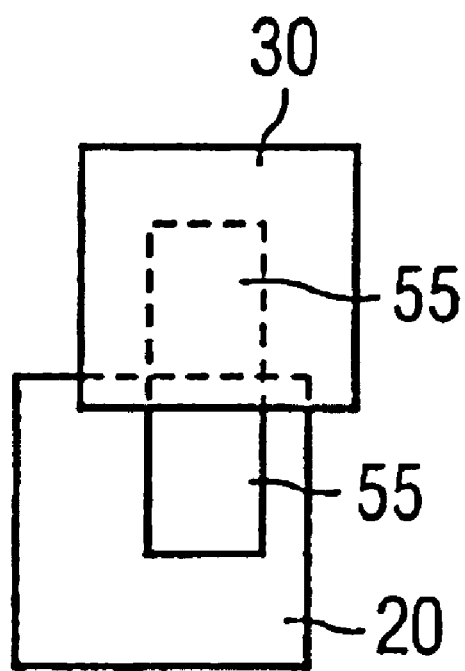

SEMICONDUCTOR MEMORY CELL

BACKGROUND OF THE INVENTION

Field of the Invention

The invention relates to a semiconductor memory cell and a method for fabricating a semiconductor memory cell.

A semiconductor memory cell can be configured as a DRAM (Dynamic Random Access Memory) cell. The semiconductor memory cell may also be configured as a ferroelectric memory cell. These memory cells include a selection transistor and a capacitor. Depending on the construction, the capacitor is a ferroelectric capacitor with a ferroelectric material or a storage capacitor with a dielectric material. The memory cell is referred to as a stacked memory cell if the selection transistor is formed in a substrate, and the storage capacitor is formed over the selection transistor and the substrate. If a ferroelectric material is utilized for capacitor insulation, for instance if PZT (lead zirconate titanate) or SBT (strontium bismuth tantalate) is used, then a temperature step must be performed in an oxygen atmosphere at over 600° C. for longer than a half hour in order to crystallize the ferroelectric material, so that it develops its advantageous ferroelectric characteristics. The disadvantage of exposing the substrate to elevated temperature in an oxygen atmosphere is that conductive regions, for instance silicon or polysilicon regions, are oxidized and thus no longer act as a conductive connection, but rather as an insulator. This can interrupt the electrical connection of the ferroelectric capacitor to the selection transistor.

According to an integration concept of a ferroelectric offset storage cell which is known from the prior art, the lower electrode, which faces the substrate, of the ferroelectric capacitor is fashioned as the common electrode, and the upper electrode of the ferroelectric capacitor forms the respective storage node. This configuration is able to withstand temperature steps at high temperatures in an oxygen atmosphere, because the contact for the electrical connection between the ferroelectric capacitor and the selection transistor is not produced until after the temperature step for recrystallizing the ferroelectric material. As a consequence, an oxidation of this contact owing to the recrystallization is out of the question. The disadvantage of this cell configuration is that the substrate area occupied by this memory cell is larger than 15 $F^2$. F represents the minimum lithographically achievable dimension of the underlying semiconductor technology. This is substantially larger than the 8 $F^2$ which is common today for a DRAM cell. As a consequence, the integration density of this configuration is not particularly large.

According to another configuration of a ferroelectric memory cell taught by the prior art, memory cells of less than 8 $F^2$ are possible. Because the memory node is situated over the selection transistor, this cell configuration is referred to as a stacked cell. Here, the bottom electrode of the storage capacitor is the storage node, and the top electrode can be constructed as a common counterelectrode of all storage capacitors. Alternatively, the counterelectrode can also be structured individually. In this concept, a conductive terminal is required between the bottom electrode and the selection transistor. Because this terminal is usually formed before the ferroelectric capacitor is formed and must therefore endure the temperature step in an oxygen atmosphere, this electrical terminal is normally protected from oxidation at great expense, including additional costs and processing steps. Furthermore, the ferroelectric capacitor must also be protected from the silicon that diffuses out of the electrical contact. The barrier materials that are known from the prior art are presently not able to withstand a temperature step at an elevated temperature, such as would be required for the recrystallization of a ferroelectric material in order to achieve optimal characteristics. Therefore, lower temperatures and shorter time periods are selected for annealing the ferroelectric layer than would be necessary for an optimal ferroelectric character. Furthermore, when recrystallization temperatures are too low, the tendency of SBT is that large leakage currents flow through it. In addition, greater damage can be caused by hydrogen than would be the case given a well crystallized SBT.

U.S. Pat. No. 5,719,416 describes a semiconductor memory cell with a selection transistor and, provided next to this over the semiconductor substrate, a planar storage capacitor. The storage capacitor includes an elongated lower electrode facing in the direction of the transistor. A doped region of the transistor and the elongated portion of the lower electrode of the capacitor are connected to one another. The connecting contact leads through the insulation layer that separates the transistor and the capacitor, and it touches the elongated portion of the capacitor on this top surface, i.e. the surface which is averted from the substrate.

U.S. Pat. No. 5,604,145 teaches a semiconductor memory cell with a capacitor provided over the selection transistor and the semiconductor substrate. A bottom layer of the capacitor is connected to a doped region of the transistor via a vertical contact.

Published European Patent Application No. EP 0 971 392 discloses a memory cell with a selection transistor and a capacitor with a planar layer sequence alongside thereto.

SUMMARY OF THE INVENTION

It is accordingly an object of the invention to provide a semiconductor memory cell having a transistor and a capacitor that overcomes the above-mentioned disadvantages of the heretofore-known memory cells of this general type. A further object of the invention is to provide a method for fabricating a semiconductor memory cell.

With the foregoing and other objects in view there is provided, in accordance with the invention, a semiconductor memory cell, including:

a substrate having a surface;

a transistor including a doped region disposed in the substrate;

an insulation layer disposed on the substrate and on the transistor;

an electrically conductive contact extending from the doped region through the insulation layer;

a conductive contact layer disposed on the insulation layer, the conductive contact layer having a first surface facing the surface of the substrate, having a second surface averted from the surface of the substrate, and having a lateral surface connecting the first surface of the conductive contact layer to the second surface of the conductive contact layer;

the electrically conductive contact touching the lateral surface of the conductive contact layer;

a capacitor including a bottom capacitor electrode disposed above the insulation layer, a capacitor insulator disposed on the bottom capacitor electrode, and a top capacitor electrode disposed on the capacitor insulator; and the electrically conductive contact conductively connecting, via the conductive contact layer, the bottom capacitor electrode to the doped region disposed in the substrate.

In other words, with respect to the semiconductor memory cell, the object of the invention is achieved by a semiconductor memory cell including:

a capacitor, a transistor, a substrate with a surface, and an electrically conductive contact, whereby:

the transistor includes a doped region which is disposed in the substrate;

a first insulation layer is disposed on the substrate and on the transistor;

the electrically conductive contact extends from the doped region through the first insulation layer;

a conductive contact layer is disposed on the first insulation layer; and the conductive contact layer includes a surface facing the surface of the substrate, a surface that is averted from the from the surface of the substrate, and a lateral surface which connects these surfaces;

the capacitor includes a lower capacitor electrode, which is provided over the first insulation layer; a capacitor insulator, which is provided on the lower capacitor electrode; and an upper capacitor electrode, which is provided on the capacitor insulator;

the electrically conductive contact conductively connects the lower capacitor electrode to the doped region via the contact layer; and the electrically conductive contact touches the lateral surface of the contact layer.

The electrical contact is provided so as to connect the lower capacitor electrode to the doped region. The electrical contact therein is provided alongside the capacitor. This way, a contact hole can be formed in the first insulation layer next to the capacitor without impairing the top capacitor electrode. The bottom capacitor electrode is subsequently electrically connected to the doped region of the transistor through the use of the contact material with which the contact hole is filled.

The contact to the bottom electrode can be self-aligning relative to a conductive layer on which the bottom capacitor electrode is disposed. This layer can include a noble metal or consist of a noble metal. The conductive layer can be buried under the capacitor and protrude alongside the capacitor. The contact hole which is formed beside the capacitor can then partially expose the conductive layer, and a contact material which is filled into the contact hole can conductively connect the conductive layer to the doped region of the transistor. If the conductive layer contains a noble metal, the formation of a non-conductive layer as a result of the thermal recrystallization of the ferroelectric material can be prevented. Another advantage is that the capacitor can be subjected to thermal annealing steps for recrystallization before the electrical contact is formed. This way, temperature steps can even be carried out at temperatures above 800° C. and for longer than 45 minutes. With the temperature step, a ferroelectric material acquires optimal characteristics. Another advantage is that the capacitor is completely formed before the electrical contact is formed. In addition, it is possible to forgo an additional diffusion barrier such as would be required for protecting an electrical contact in a recrystallization step at high temperatures. This simplifies the procedure and lowers the costs. Furthermore, it is possible to utilize a substantially thinner bottom electrode than is typically necessary in order to guarantee a diffusion barrier effect for the electrical contact.

Another advantage is that the dielectric or ferroelectric layer is deposited on a planarized wafer surface. The advantage of this is that an increased conformity of the dielectric layer or ferroelectric layer is possible. Another advantage is that the memory node has no additional topology. This is advantageous because the applied dielectric material or ferroelectric material is not stressed by edges or curves at which electrical breakdowns could occur. Another advantage is that the capacitor can be structured with a single masking step. For instance, standard titanium or titanium nitride barriers are suitable for preventing the interaction between the electrical connection and the conductive layer which contains a noble metal and on which the capacitor is formed.

Besides this, what is known as a landed via concept is possible. Here, conductive contacts are formed in a bottom insulating layer as plugs in contact holes. Next, the top insulating layer is applied. According to the invention, a capacitor with a strap is produced in the top dielectric. Contact holes in the top insulating layer are so structured that the surface of the bottom contact plugs in the bottom insulating layer is exposed, so that the contact plugs in the top insulating layer are in conductive contact with the bottom electrode with the bottom contact plugs.

The advantage of the solution according to the invention is that substantially fewer mask exposure steps and thus substantially fewer processing steps are needed, which makes the fabrication process more cost-effective and enables a higher yield.

Furthermore, a memory cell requires only a small portion of the substrate surface, because there is a partial overlap between the bottom capacitor electrode and the conductive layer. As a result, the cell is considerably smaller than an offset cell, in which the top capacitor electrode represents the memory node and is connected to the doped region of the transistor through the use of an electrical contact alongside the capacitor.

For instance, the conductive contact layer can contain platinum or iridium or iridium oxide.

In this application, the term capacitor insulator refers to the insulation between the two electrodes of the capacitor. The capacitor insulator can include a dielectric or ferroelectric material.

An advantageous development of the semiconductor memory cell provides that the electrical contact extend from the doped region through the first insulating layer.

According to another feature of the invention, the electrically conductive contact also touches the conductive contact layer at the second surface averted from the surface of the substrate.

An advantageous development of the invention provides that a conductive contact layer be disposed on the first insulation layer, and that the bottom capacitor electrode be disposed on the conductive contact layer. The conductive contact layer can be slightly out of alignment with respect to the bottom capacitor electrode, i.e. offset relative to it, so that the electrical contact from the doped region through the insulation layer contacts the conductive contact layer but does not touch the capacitor itself.

Another advantageous development of the semiconductor memory cell provides that a second insulation layer be disposed between the first insulation layer and the conductive contact layer. The second insulation layer can act as a diffusion barrier for oxygen and, respectively, for silicon or as an etch stop layer during memory cell fabrication. In a preferred exemplary embodiment, this layer is formed of silicon nitride.

Another advantageous development of the semiconductor memory cell according to the invention provides that a third insulation layer be disposed on the second insulation layer alongside the conductive contact layer. The third insulation layer is disposed alongside the conductive contact layer as a filler material, so that the substrate surface with the embedded conductive contact layer can be planarized by a CMP (Chemical Mechanical Polishing) procedure. The contact layer can be polished (damascene process), but also the third insulation layer, optionally together with the hard mask from the structuring of the contact layer. The advantage of this is that a subsequently deposited dielectric or ferroelectric layer will be deposited on a plane substrate surface and can thus be formed with higher quality.

Another advantageous development of the semiconductor memory cell according to the invention provides that the bottom capacitor electrode include the conductive contact layer. This means that the bottom capacitor electrode is formed somewhat larger than the top capacitor electrode, so that in the formation of the contact hole for the electrical contact, the bottom capacitor electrode is exposed by the contact hole, while the top capacitor electrode remains untouched by the contact hole.

Another advantageous development of the semiconductor memory cell according to the invention provides that the electrical contact touches the conductive layer. This allows an electrical contact between the bottom capacitor electrode and the doped region of the transistor.

Another advantageous development of the semiconductor memory cell according to the invention provides that the conductive contact layer includes a surface on which the bottom capacitor electrode is disposed; the conductive contact layer includes a side wall which is disposed alongside the contact layer; and the electrical contact at least partly touches the surface and the side wall.

This allows a self-aligned electrical contact. In the etching of a contact hole, the conductive contact layer is exposed and acts as an etch mask, whereby a contact, which will subsequently fill the contact hole, touches the conductive layer both laterally and from above.

Another advantageous development of the semiconductor memory cell according to the invention provides that the top capacitor electrode includes a second surface, which is averted from the substrate; and the electrical contact includes a third surface, which is averted from the substrate; and the third surface is further than the second surface from the substrate.

The electrical contact can protrude beyond the capacitor.

With the objects of the invention in view there is also provided, a method of producing a semiconductor memory cell, the method includes the steps of:

providing a substrate;

forming a transistor on the substrate and forming a doped region of the transistor in the substrate;

depositing an insulation layer on the substrate and on the transistor;

forming a structured conductive contact layer with a first surface facing a surface of the substrate, with a second surface averted from the surface of the substrate, and with a lateral surface connecting the first surface and the second surface;

forming a capacitor insulator on the conductive contact layer;

forming a top capacitor electrode on the capacitor insulator;

performing a temperature step for recrystallizing the capacitor insulator;

subsequently forming a contact hole in the insulation layer such that the contact hole is laterally next to the top capacitor electrode and extends to the doped region; and filling the contact hole with a conductive material such that the conductive contact layer is conductively connected to the conductive material at the lateral surface of the conductive contact layer.

In other words, with respect to the method, the object of the invention is achieved by a method for fabricating a semiconductor memory cell with the steps:

providing a substrate;

forming a transistor on the substrate, thereby forming a doped region of the transistor in the substrate;

depositing a first insulation layer on the substrate and on the transistor;

forming a structured conductive contact layer with one surface facing the surface of the substrate, one surface averted from the surface of the substrate, and a lateral region connecting these surfaces;

forming a capacitor insulator on the conductive contact layer;

forming a top capacitor electrode on the capacitor insulator;

carrying out a temperature step for recrystallizing the capacitor insulator;

next, forming a contact hole alongside the top capacitor electrode in the insulation layer, extending the hole to the doped region;

filling the contact hole with a conductive material, so that the conductive contact layer at the lateral surface is conductively connected to the conductive material.

Another mode of the invention provides that a contact hole be etched into the first insulation layer, exposing the doped region and the conductive contact layer, and that the contact hole is then filled with the electrical contact.

The advantage of forming the electrical contact afterward is that it cannot be affected by a temperature step for recrystallizing the capacitor insulator.

Another advantageous step provides that a bottom electrical contact be formed prior to the deposition of the capacitor insulator in the first insulation layer, and that the electrical contact be formed subsequent to the deposition of the capacitor insulator on the bottom electrical contact, and that it connects the bottom electrical contact to the conductive contact layer.

The electrical contact and the top electrical contact are suitable for realizing what is known as a landed via contact.

An additional advantageous step provides that a bottom capacitor electrode be formed between the conductive contact layer and the capacitor insulator. On one hand, the conductive contact layer can itself be utilized as the bottom capacitor electrode; or on the other hand, a bottom capacitor electrode can be additionally formed on the conductive contact layer, so that an etch selectivity can be achieved, for instance on the basis of the utilized materials. This also makes it possible to lead the contact through under the capacitor.

Other features which are considered as characteristic for the invention are set forth in the appended claims.

Although the invention is illustrated and described herein as embodied in a semiconductor memory cell and method for fabricating a semiconductor memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic, partial sectional view of yet another stacked memory cell according to the invention;

FIG. 4 is a diagrammatic, partial sectional view of a further stacked memory cell according to the invention;

FIG. 7 is a plan view of a detail of the memory cell field of FIG. 6.

DESCRIPTION OF THE PREFERRED EMBODIMENTS

Figure 1:
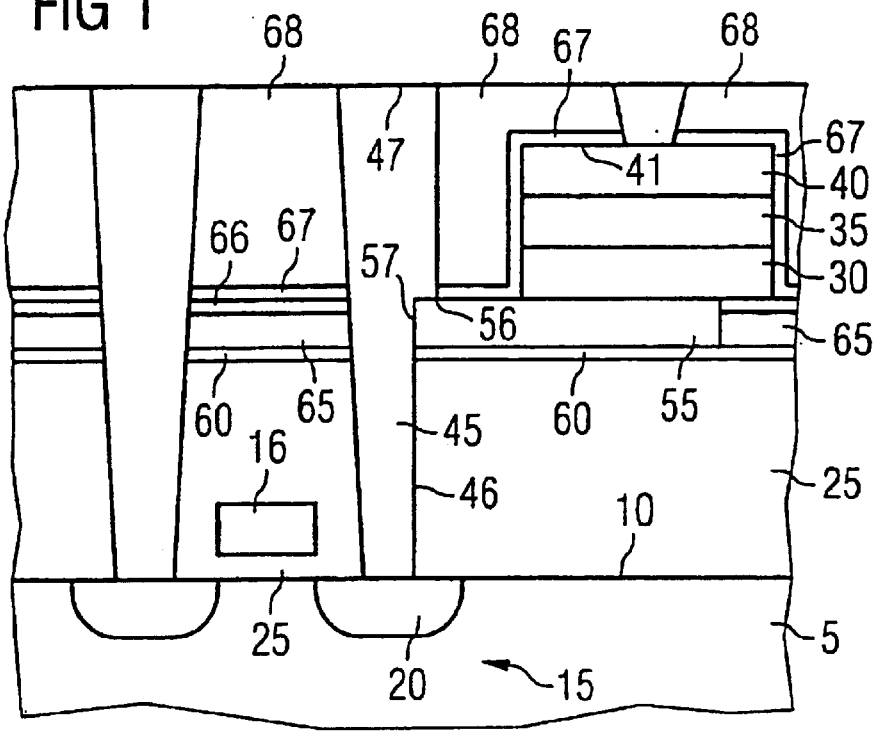
FIG. 1 is a diagrammatic, partial sectional view of a stacked memory cell according to the invention.

Referring now to the figures of the drawings in detail and first, particularly, to FIG. 1 thereof, there is shown a stacked memory cell with a substrate 5. The substrate 5 has a substantially planar surface 10. A transistor 15 including a gate 16 and a doped region 20 has been formed in the substrate 5. A first insulation layer 25 is disposed on the substrate 5 and the transistor 15. Disposed on the first insulation layer 25 is a capacitor including a bottom capacitor electrode 30, a capacitor insulator 35 and a top capacitor electrode 40. The bottom capacitor electrode 30 is disposed on the first insulation layer 25. Disposed on the bottom capacitor electrode 30 is the capacitor insulator 35, and on this the top capacitor electrode 40. Further provided is a conductive contact layer 55 between the bottom capacitor electrode 30 and the first insulation layer 25. The bottom capacitor electrode 30 is disposed directly on the conductive contact layer 55 in order to form an electrical connection with it. The conductive contact layer 55 includes a surface 56, which is averted from the substrate 5, and a side wall 57, which is disposed alongside the conductive contact layer 55 and stands perpendicular to the surface 56. The top capacitor electrode 40 includes a second surface 41 which is averted from the substrate.

Further provided between the conductive contact layer 55 and the first insulation layer 25 is a second insulation layer 60. The second insulation layer 60 serves as an etch stop during the fabrication of the represented structure or as a diffusion barrier. Alongside the conductive contact layer 55, a third insulation layer 65 is disposed on the insulation layer 60. A fourth insulation layer 66 is disposed on the third insulation layer 65; a fifth insulation layer 67 is disposed on the fourth insulation layer 66; and a sixth insulation layer 68 is disposed on the fifth insulation layer 67. A contact hole 46 is provided in the first insulation layer 25, the second insulation layer 60, the third insulation layer 65, the fourth insulation layer 66, the fifth insulation layer 67 and the sixth insulation layer 68. The contact hole 46 exposes the conductive contact layer 55 and the doped region 20 and is filled with an electrical contact 45. The electrical contact 45 forms an electrical connection between the doped region 20 and the conductive contact layer 55. The electrical contact 45 includes a third surface 47 which is averted from the substrate 5. The third surface 47 is further away from the substrate 5 than the second surface 41. The electrical contact 45 conductively connects the bottom capacitor electrode to the doped region 20 and is disposed alongside the capacitor.

The conductive contact layer 55 includes a bottom surface, which is aligned substantially parallel to the surface or main surface 10 of the substrate 5. The bottom surface of the conductive contact layer 55 faces the semiconductor substrate 5. Another top surface of the conductive contact layer 55 is averted from the semiconductor substrate 5 and faces the capacitor. Bottom and top surfaces of the conductive contact layer 55 run substantially parallel to one another and to the surface 10 of the substrate 5. A substantially vertical portion 57 of the surface connects the bottom and top surfaces of the conductive contact layer 55 to one another on the side of the contact 55. In the cross-section represented in FIG. 1, the surface portion 57 is provided laterally at the end of the conductive contact layer 55. The electrical connection between the conductive material of the contact 45 and the contact layer 55 is formed by the lateral region 57 and the adjoining small portion 56 of the top surface, which is averted from the substrate 5, of the contact layer 55. This small portion is exposed in the contact hole 46. The conductive material of the contact 45 touches the exposed surface portions 57, 56 of the contact layer 55.

According to a method for fabricating the configuration represented in FIG. 1, first the transistor 15 is formed in the substrate 5, and then the first insulation layer 25 is deposited on the substrate 5 and the transistor 15. The first insulation layer can be formed of a doped silicon oxide layer such as BPSG (boron phosphorous silicate glass).

Next, the second insulation layer 60 is applied onto the first insulation layer 25. This is can be accomplished by an LPCVD (Low Pressure Chemical Vapor Deposition) technique, for instance. The second insulation layer 60 is formed 50 nm thick. The second insulation layer 60 exemplarily is formed of silicon nitride and can remain on the back side of the wafer as a guard layer in order to protect against wafer contamination. Next, the third insulation layer 65 is applied by a TEOS (Tetra Ethyl Ortho Silicate) CVD (Chemical Vapor Deposition). The applied silicon oxide layer is 150 nm thick and approximately determines the thickness of the conductive contact layer 55 that is to be formed. Next, the fourth insulation layer 66 is formed on the third insulation layer 65. An LPCVD (Low Pressure Chemical Vapor Deposition) procedure can also be utilized for this, which forms a 50-nm-thick silicon nitride layer.

Next, the fourth insulation layer 66 is covered by an etch mask which contains a window in which the fourth insulation layer 66 is exposed. A first, non-selective etching process is carried out, for instance in a plasma etching chamber MXP PLUS (from the company APPLIED MATERIALS) given a gas flow of approx. 17 sccm (standard cubic centimeters per minute) $CHF_3$, 17 sccm $CF_4$, and 80 sccm argon, a pressure of 9.3 Pa (70 mTorr), and a magnetic field of 30 Gauss given a power induction of 750 watts. Other types of apparatuses and etching techniques can be analogously applied. The fourth insulation layer 66 and part of the third insulation layer 65 are therein removed in the window of the etch mask. Next, a second etch step with a high selectivity for oxide with respect to nitride is carried out. This is possible with a gas flow of 10 sccm $C_4F_8$, 2 sccm oxygen, 100 sccm argon and 80 sccm carbon monoxide, given a pressure of 20 Pa (150 mTorr), a magnetic field of 30 Gauss, and a power induction of 700 watts in the MXP PLUS plasma etching chamber. The etching process stops selectively on the second insulation layer 60. The etched trench is then filled with the conductive contact layer 55. This is possible by sputter deposition, whereby iridium dioxide or a noble metal is deposited in the trench.

Next, a CMP (Chemical Mechanical Polishing) planarization step is carried out, in which the conductive contact layer 55 is removed from the fourth insulation layer 66 and remains in the trench on the second insulation layer 60. Next, the bottom capacitor electrode 30 is deposited from platinum surface-wide with a thickness of approx. 100 nm. On this, the capacitor insulator 35 is deposited, for instance as a 180-nm-thick layer of SBT (strontium bismuth tantalate). Next, the top capacitor electrode 40 is deposited in a thickness of approx. 100 nm on the recently deposited capacitor insulator 35, and the SBT layer is recrystallized in a temperature step at a temperature above 650° C. for over a half hour. Next, a mask of photosensitive resist is placed onto the top capacitor electrode 40 when it is still a surface-wide deposition, and the mask is structured.

Next, the capacitor is structured with the aid of the photoresist mask and an argon sputter etching technique in an MXPR2 etching chamber (manufactured by APPLIED MATERIALS) given an argon flow of approx. 50 sccm, a pressure of 1.3 Pa (10 mTorr), a magnetic field of 80 Gauss, and a power induction of 750 watts. Other types of apparatuses can be analogously utilized for the etching. The etching is carried out alongside the capacitor in such a way that it progresses down to the fourth insulation layer 66 and the conductive contact layer 55, which is formed of iridium dioxide, for example. A hot cathode DPS (Decoupled Plasma Source) plasma etching chamber with an oxide mask is also suitable for structuring platinum capacitor electrodes without fences.

Next, the fifth insulation layer 67 is deposited, for instance as a silicon nitride layer. On this, an approx. 1200-nm-thick silicon oxide layer is deposited by TEOS deposition, and the wafer is planarized by CMP. Next, the contact hole 46 is etched with the aid of an additional lithographic mask. In this process, the contact hole 46 partially overlaps the conductive contact layer 55. Moreover, the contact hole 46 exposes the doped region 20. The etching of the contact hole can be carried out with a high selectivity between silicon oxide and the noble metal of which the conductive contact layer 55 is formed of. Suitable parameters for this process are: a gas flow of 5 sccm $C_4F_8$, 30 sccm $CHF_3$, 15 sccm $CF_4$ and 80 sccm argon given a pressure of 26.6 Pa (200 mTorr) and a magnetic field of 60 Gauss given a power induction of 750 watts in an MXP PLUS plasma etching apparatus. The contact hole is formed self-aligned relative to the conductive contact layer 55.

Not all contact holes are self-aligned relative to a contact layer 55; other contacts are etched down to the second diffusion region of the transistor.

Figure 2:
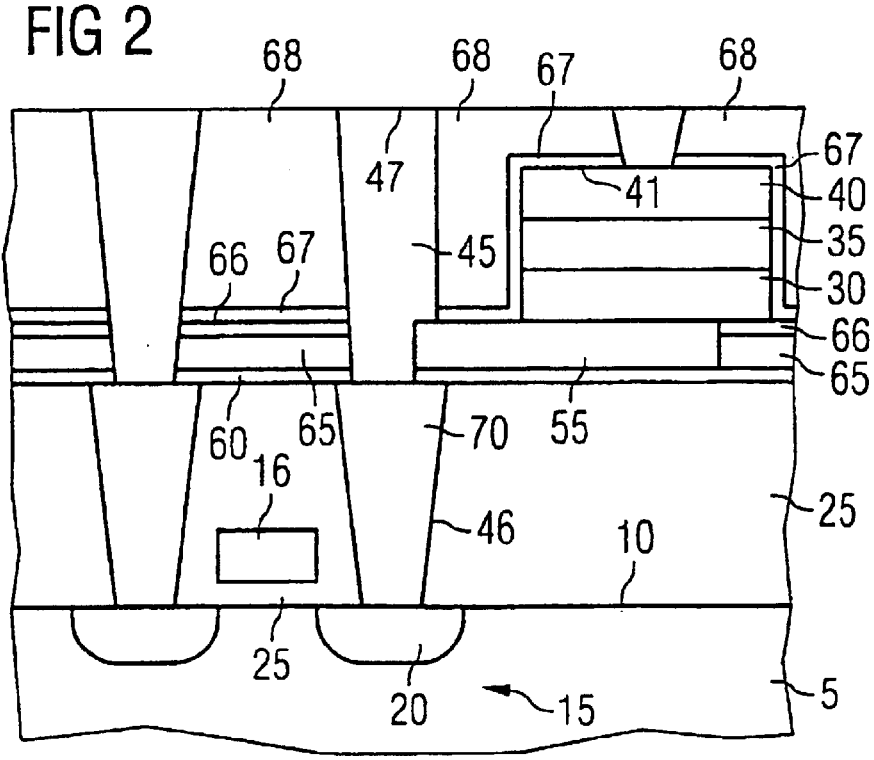
FIG. 2 is a diagrammatic, partial sectional view of another stacked memory cell according to the invention.

With reference to FIG. 2, a bottom electrical contact 70 is formed only in the first insulation layer 25, and the electrical contact 45 forms the electrical contact between the conductive contact layer 55 and the bottom electrical contact 70. In the fabrication process, the contact hole 46 and the bottom electrical contact 70 are formed before the second insulating layer 60, for instance a silicon nitride layer which is 50 nm thick, is deposited. The upper diameter of the bottom electrical contact 70 is selected such that a landed via concept can be realized with the electrical contact 45. To accomplish this, the diameter of the electrical contact 45 may optionally be less than, equal to, or greater than the diameter of the bottom electrical contact 70.

The silicon nitride layer 60 protects the bottom electrical contact 70 in a recrystallization process which is carried out as an oxidation process at a high temperature in an oxygen-rich atmosphere. Another advantage is that the contact 45 must only be formed down to the depth of the bottom electrical contact 70, whereby the aspect ratio of the contact hole for the contact 45 remains substantially smaller because the etching of the contact 45 is easier.

With reference to FIG. 3, an additional variant of the method for forming the conductive contact layer 55 will now be described. The third insulation layer 65 is formed as a TEOS deposition. Next, a platinum layer is deposited surface-wide with a thickness of 100 nm. and structured by plasma etching in such a way that the conductive contact layer 55 is formed. The conductive contact layer 55 is then encapsulated by TEOS deposition, and its top side is exposed by an oxide CMP process. Next, the bottom capacitor electrode is formed as described in connection with FIG. 1.

With reference to FIG. 4, the bottom capacitor electrode 30 is simultaneously the conductive contact layer 55. After the deposition of the nitride layer 60 and the TEOS layer 65, a platinum electrode is deposited in a thickness of 100 nm. and structured by plasma etching as conductive contact layer 55, i.e. bottom capacitor electrode 30. Next, the formation of the capacitor insulator 35 and the execution of the remaining steps are performed as described in connection with FIG. 1. The stacked capacitor stack is then etched by sputter etching, whereby only the top capacitor electrode 40 and the capacitor insulator 35 are etched, and the etching stops automatically at the bottom electrode.

Figure 5:
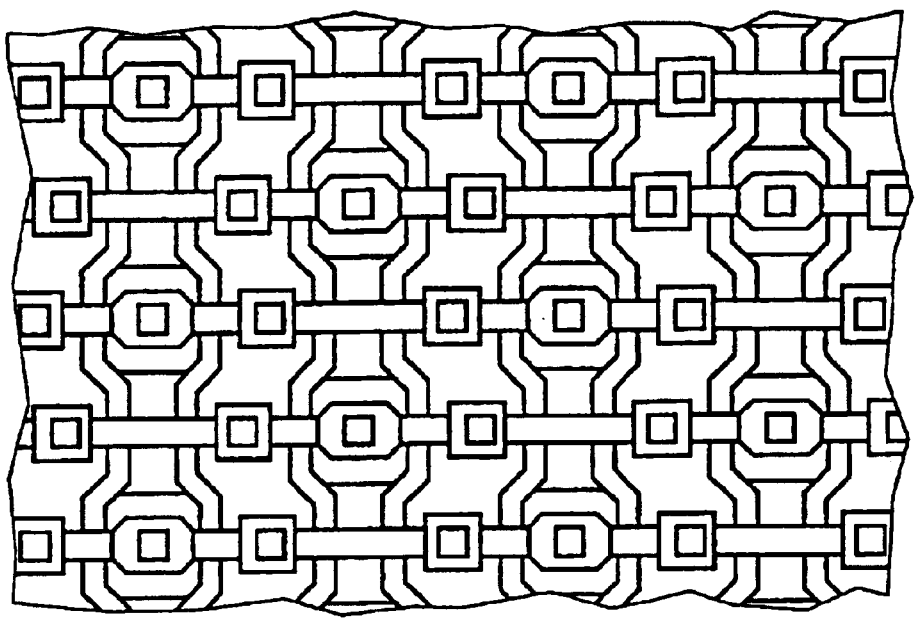
FIG. 5 is a plan view of a conventional stacked memory cell field.

FIG. 5 is a plan view of a conventional memory cell field in which a conductive diffusion barrier between the plug and capacitor must be realized.

Figure 6:
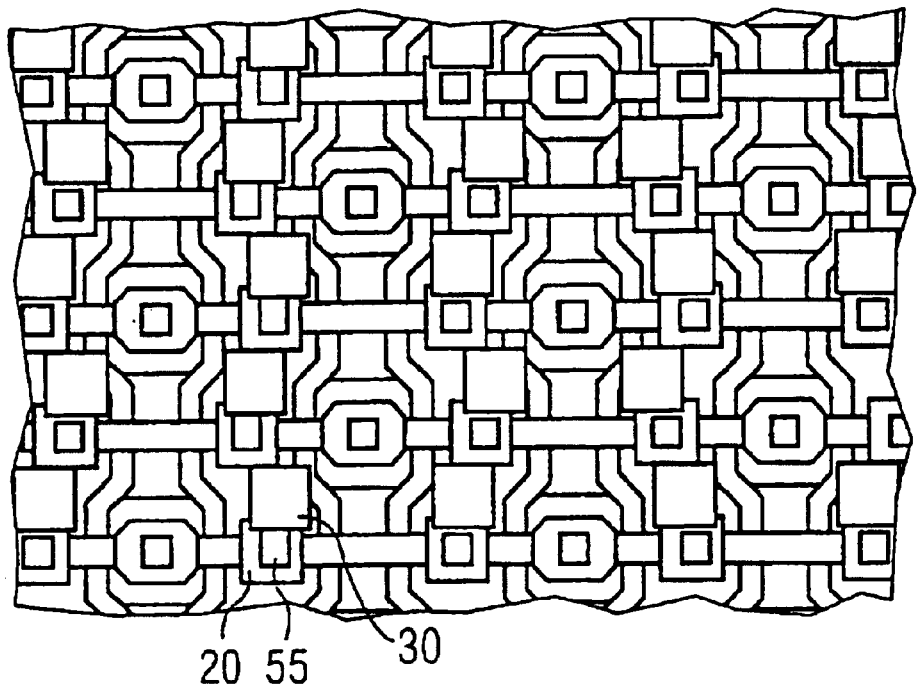
FIG. 6 is a plan view of a memory cell field according to the invention.

FIG. 6 represents the plan view of an additional memory cell field that has been realized according to the invention. The square storage node is offset relative to its usual position. The contact layer 55 is also represented. It can be clearly recognized that the size of the memory cell need not necessarily increase, because the realization of the capacitor according to the invention can be implemented in the same memory cell space, which is defined by the front end.

FIG. 7 represents a plan view of an enlarged detail of FIG. 6. Disposed on the doped region 20 is the conductive contact layer 55, on which the capacitor electrode 30 is disposed. The regions which are covered by higher layers are represented by dashed lines.

I claim:

1. A semiconductor memory cell, comprising:
   a substrate having a surface;
   a transistor including a doped region disposed in said substrate;
   an insulation layer disposed on said substrate and on said transistor;
   an electrically conductive contact extending from said doped region through said insulation layer;
   a conductive contact layer disposed on said insulation layer, said conductive contact layer having a first surface facing said surface of said substrate, having a second surface averted from said surface of said substrate, and having a lateral surface connecting to said first surface of said conductive contact layer and to said second surface of said conductive contact layer;

said electrically conductive contact touching said lateral surface of said conductive contact layer;

a capacitor including a bottom capacitor electrode disposed above said insulation layer, a capacitor insulator disposed on said bottom capacitor electrode, and a top capacitor electrode disposed on said capacitor insulator; and said electrically conductive contact conductively connecting, via said conductive contact layer, said bottom capacitor electrode to said doped region disposed in said substrate.

2. The semiconductor memory cell according to claim 1, wherein said electrically conductive contact also touches said conductive contact layer at said second surface averted from said surface of said substrate.

3. The semiconductor memory cell according to claim 1, wherein said bottom capacitor electrode is disposed on said conductive contact layer and contacts said conductive contact layer.

4. The semiconductor memory cell according to claim 1, wherein:

said insulation layer is a first insulation layer; and a second insulation layer is disposed between said first insulation layer and said conductive contact layer.

5. The semiconductor memory cell, according to claim 4, wherein a third insulation layer is disposed laterally alongside said conductive contact layer on said second insulation layer and beneath said bottom capacitor electrode.

6. The semiconductor memory cell, according to claim 1, wherein said bottom capacitor electrode includes said conductive contact layer.

7. The semiconductor memory cell according to claim 1, wherein:

said conductive contact layer has a surface, said bottom capacitor electrode is disposed on said surface of said conductive contact layer;

said conductive contact layer has a side wall disposed laterally adjacent to said surface of said conductive contact layer; and said electrically conductive contact at least partially contacts said surface of said conductive contact layer and said side wall of said conductive contact layer.

8. The semiconductor memory cell according to claim 1, wherein:

said top capacitor electrode has a surface disposed at a first distance from said substrate and averted from said substrate;

said electrically conductive contact has a surface disposed at a second distance from said substrate and averted from said substrate; and said second distance is greater than said first distance.

* * * * *